(12) United States Patent
Miller et al.

(10) Patent No.: US 8,669,540 B2
(45) Date of Patent: Mar. 11, 2014

(54) SYSTEM AND METHOD FOR GAS LEAK CONTROL IN A SUBSTRATE HOLDER

(75) Inventors: Timothy J. Miller, Ipswich, MA (US);
Richard S. Muka, Topsfield, MA (US);
Julian G. Blake, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 577 days.

(21) Appl. No.: 12/983,710

(22) Filed: Jan. 3, 2011

(65) Prior Publication Data

US 2012/0168640 A1  Jul. 5, 2012

(51) Int. Cl.
*H01J 37/08* (2006.01)

(52) U.S. Cl.
USPC ............... 250/492.3; 250/492.1; 250/492.2

(58) Field of Classification Search
USPC ........................... 250/492.1–492.3
See application file for complete search history.

(56) References Cited

U.S. PATENT DOCUMENTS

| 2003/0168439 A1* | 9/2003 | Kanno et al. ............... 219/390 |
| 2004/0173581 A1* | 9/2004 | Udo et al. ............... 219/121.51 |
| 2006/0207725 A1* | 9/2006 | Oohashi et al. ............ 156/345.53 |
| 2007/0007276 A1* | 1/2007 | Steger ..................... 219/494 |
| 2012/0200980 A1* | 8/2012 | Blake et al. .............. 361/212 |

\* cited by examiner

*Primary Examiner* — Michael Maskell (57) ABSTRACT

An electrostatic clamp includes a heating block for heating a substrate, the heating block having a first surface disposed toward the substrate and a second surface opposite the first surface. A base is arranged to adjoin at least a portion of the second surface of the heating block. The adjoined base and heating block may mutually define an inner gap between a first portion of the heating block and the base. An outer gap is arranged concentric with the inner gap between a second portion of the heating block and the base, the inner and outer gaps being isolated from one another by a first sealing surface formed between the second surface of the heating block and the base.

17 Claims, 5 Drawing Sheets

SYSTEM AND METHOD FOR GAS LEAK CONTROL IN A SUBSTRATE HOLDER

FIELD

This invention relates to substrate holders, and more particularly, to controlling leaks in electrostatic clamp systems.

BACKGROUND

Substrate holders, such as electrostatic clamps, are widely deployed in apparatus that impart heat into substrates, which may require controlled heat transfer into or out of the substrate holder to maintain the proper substrate temperature. The heat may be imparted from a process itself or by deliberate heating of the substrate. In resistively heated electrostatic clamps, gas may be provided between a heating block and a cooled base in order to aid thermal transfer. Because the heating block and base may comprise dissimilar materials, such as a ceramic and a metal, respectively, it may be necessary to avoid bonding the two components together to avoid excessive thermal mismatch strains when the block is heated. The use of gas to transfer heat from the heating block may therefore be necessary since thermal transfer may be very low in a low pressure ambient if the base is not bonded to the heating block. The temperature mismatch between the ceramic and base may be reduced by using a high enough pressure of gas to rapidly transfer heat away from the ceramic. However, the gas supplied between ceramic and metal may leak along the interface between base and heater block and into a process chamber containing the electrostatic clamp. The unwanted gas leakage may lead to poor process control or substrate contamination in processes that depend on control of the gas ambient in the process chamber, including plasma or beamline implantation processes in ion implanters.

Figure 1A:
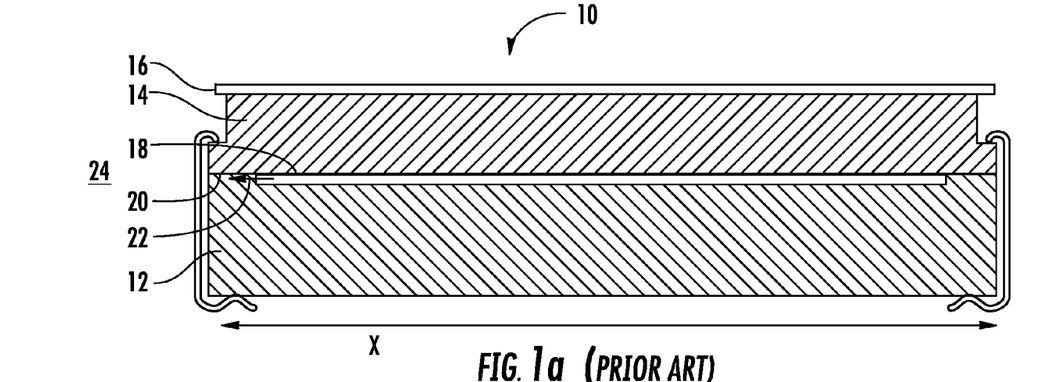
FIG. 1a is a cross-section of a known electrostatic clamp arrangement.

FIG. 1a depicts a prior art ESC configuration 10 in which a base 12 and heating block 14 are joined together. ESC 10 includes a heater (not shown), which may be used to resistively heat substrates that are supported by the heating block 104. ESC 10 may operate as a substrate holder in a process chamber, such as a low pressure chamber for performing one or more processes on the substrate. Examples of such low pressure chambers include plasma and ion beam tools, which may be evacuated to a pressure of $10^{-7}$ Torr or less before substrate processing and may operate in an ambient gas pressure in the range of $10^{-7}$-$10^0$ torr, for example.

During processing, substrates 16 may be heated to a fixed temperature using heating block 14. In order to maintain process control, base 12 may act as a heat sink to maintain proper heat flow out of heating block 14, and thereby more accurately control substrate temperature, as well as temperature in the heating block. In order to provide appropriate heat conduction between heating block 14 and base 12, a gas may provided through an inlet (not shown) into a narrow gap (chamber) 18 formed between heating block 14 and base 12. The gas may aide in thermal conduction to maintain a rapid heat flow into base 12. This configuration also helps avoid thermal mismatch problems between base 12 and heating block 14 that may occur between the base and heating block, as noted above.

However, the prior art ESC configuration of FIG. 1 may result in gas leaks into the process chamber 24 outside of ESC 10. For example, gas may leak along interface 20 located between heating block 14 and base 12 that is located towards the outside of gap 18. Because heating block 14 may be a ceramic and base 12 may be a metal, the interfaces may move with respect to one another during heating. In addition, the dissimilar materials may not form an intimate contact at their mutual interface, leading to appreciable leakage of gas in the direction 22. For example, the pressure in gap 18 may be several tens or of Torr or higher and the pressure outside ESC 10 may be in the mTorr range or less, which large pressure differential, combined with the imperfect seal at interface 22, may cause a large leak rate of gas into the substrate processing chamber 24.

Figure 1B:
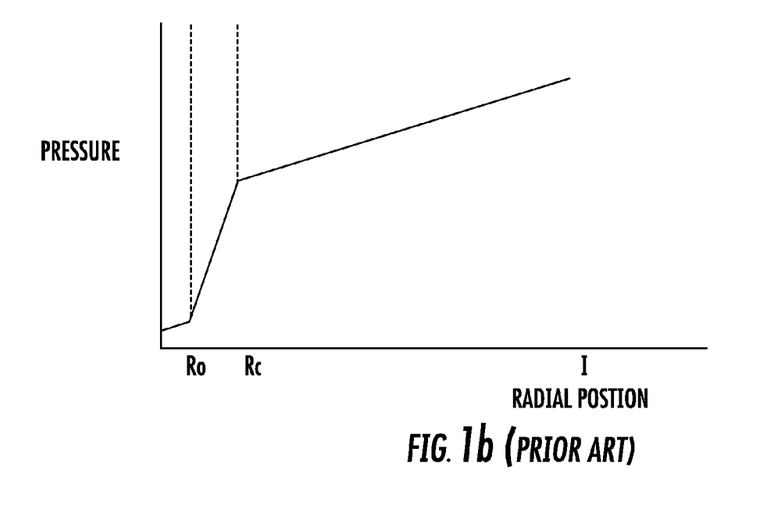

Concomitant with gas leakage, the gas pressure may vary across the gap 18, as illustrated in FIG. 1b, leading to temperature non-uniformities across ESC 10. The pressure may be highest near the center of the ESC at point I, which may be located near an inlet of gas (not shown) provided to the gap. The pressure may steadily drop toward the outer portion of the gap 18 ($R_C$) and then rapidly drop across the nominal sealing surface 22 to the outside edge $R^O$ of the ESC, as gas leaks out of gap 18. This varying pressure may result in a temperature gradient along the x-direction as the rate of heat conduction from heater block 14 to base 12 varies.

It will be apparent therefore that improvements are desirable over known ESC configurations used for heating substrates.

SUMMARY

In one embodiment, an electrostatic clamp includes a heating block for heating a substrate, the heating block having a first surface disposed toward the substrate and a second surface opposite the first surface. A base is arranged to adjoin at least a portion of the second surface of the heating block. The adjoined base and heating block may mutually define an inner gap between a first portion of the heating block and the base. An outer gap is arranged concentric with the inner gap between a second portion of the heating block and the base, the inner and outer gaps being isolated from one another by a first sealing surface formed between the second surface of the heating block and the base.

In another embodiment, an electrostatic clamp includes a base portion having a first surface and an outer block for supporting a substrate in a process chamber, the outer block having a second surface arranged to adjoin at least a portion of the first surface of the base portion. The electrostatic clamp may further include a first annular portion coupled to an outer surface of the outer block, the first annular portion having a first sealing surface, and a second annular portion coupled to the outer surface of the outer block and having a second sealing surface. The first annular portion may define an inner compartment and the first and second annular portion together may define an outer compartment concentric with the inner compartment when the substrate is placed on the first and second sealing surfaces.

BRIEF DESCRIPTION OF THE DRAWINGS

For a better understanding of the present disclosure, reference is made to the accompanying drawings, which are incorporated herein by reference and in which:

FIG. 1b depicts gas pressure variation as a function of position in the electrostatic clamp of FIG. 1a;

FIGS. 2b-2c depict gas pressure variations for different operating conditions as a function of position in the electrostatic clamp of FIG. 2a;

DETAILED DESCRIPTION

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 5:
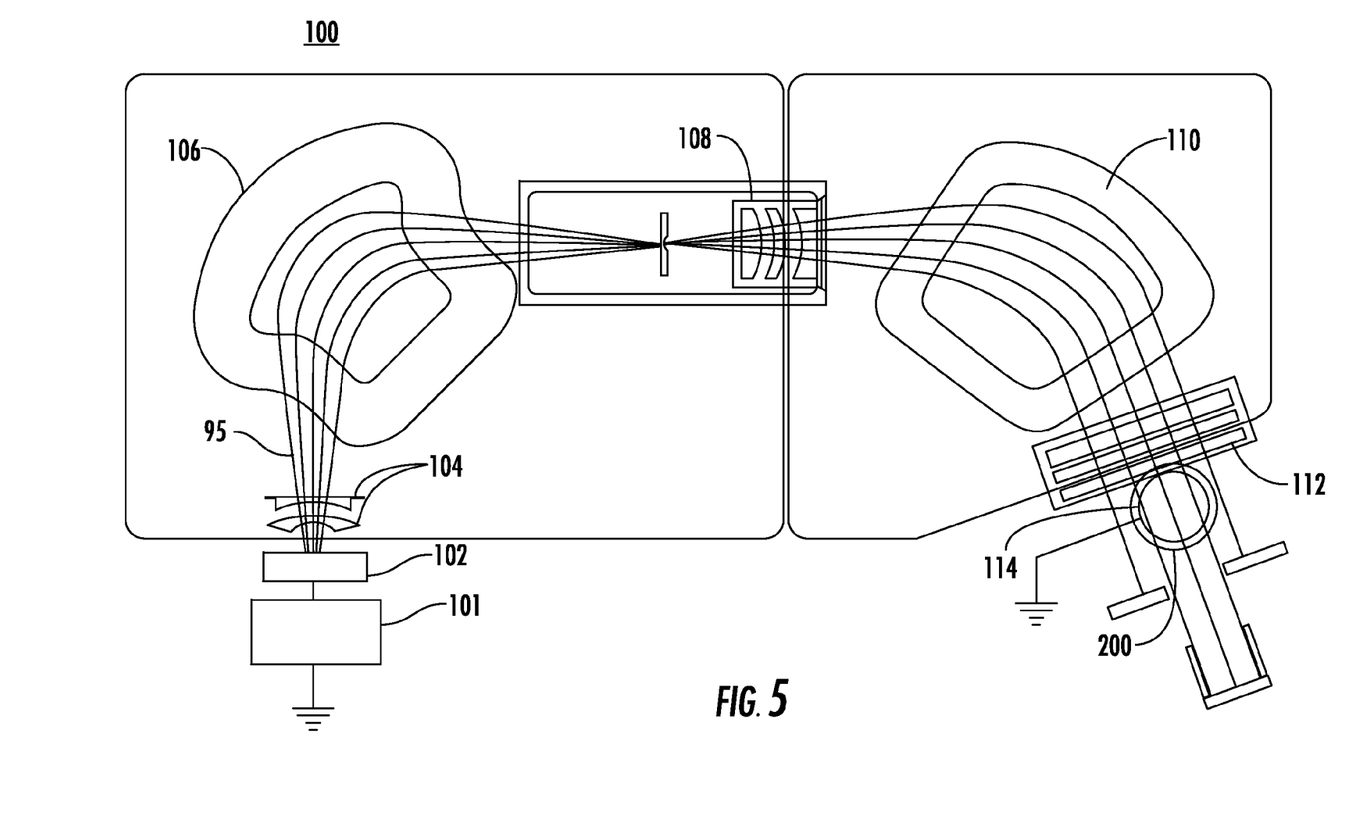
FIG. 5 is a schematic of an exemplary ion implantation system.

In various embodiments, a heated electrostatic clamp may be provided in process equipment including ion implantation systems, plasma etchers, and deposition systems, among other systems. Referring to FIG. 5, a block diagram of an ion implanter 100 including an ion source chamber 102 is shown. A power supply 101 supplies the required energy to source 102 which is configured to generate ions of a particular species. The generated ions are extracted from the source through a series of electrodes 104 (extraction electrodes) and formed into a beam 95 which passes through a mass analyzer magnet 106. The mass analyzer is configured with a particular magnetic field such that only the ions with a desired mass-to-charge ratio are able to travel through the analyzer. Ions of the desired species pass through deceleration stage 108 to corrector magnet 110. Corrector magnet 110 is energized to deflect ion beamlets in accordance with the strength and direction of the applied magnetic field to provide a ribbon beam targeted toward a work piece or substrate positioned on support (e.g. platen) 114. In some cases, a second deceleration stage 112 may be disposed between corrector magnet 110 and support 114. The ions lose energy when they collide with electrons and nuclei in the substrate and come to rest at a desired depth within the substrate based on the acceleration energy.

Figure 2A:
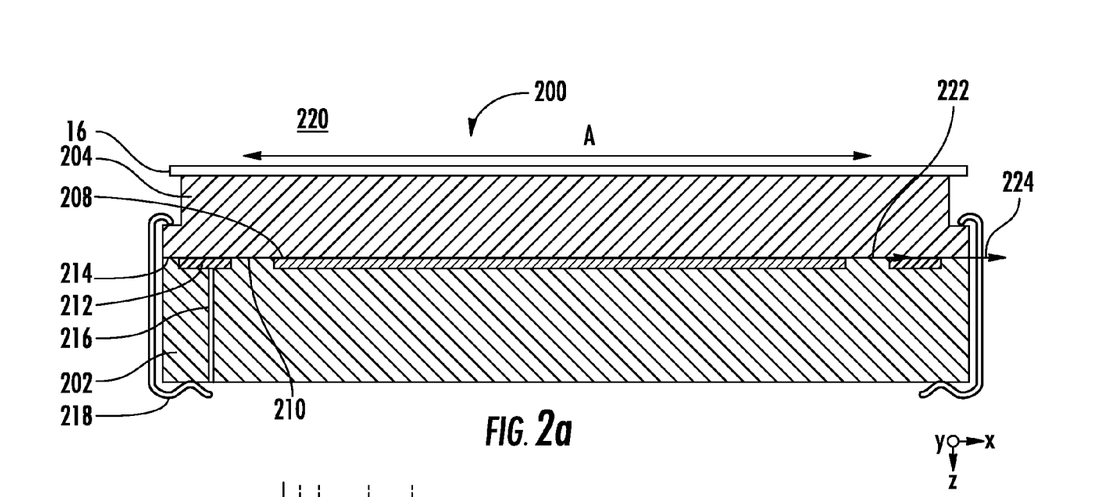
FIG. 2a is a cross-section of an electrostatic clamp embodiment.

In one embodiment of ion implantation system 100, substrate platen 114 may be an electrostatic clamp, such as the electrostatic clamp 200 depicted in FIG. 2a. The electrostatic clamp embodiment of FIG. 2a may be employed to provide substrate heating or to support an unheated substrate during an implantation process, for example. In other embodiments, the electrostatic clamp 200 may be used to provide substrate heating in other processing apparatus.

As detailed below, electrostatic clamp (or "clamp") 200 may facilitate control of process conditions during substrate processing by providing good thermal transfer of heat from a substrate heating block, while minimizing the introduction of gas contaminants into the ambient surrounding the substrate. As is well known, electrostatic clamps may provide sufficient gripping force on a substrate to be especially effective at low pressures (less than several tens of Torr, for example). Electrostatic clamp 200 may, for example, be particularly useful in low pressure apparatus, such as plasma processing systems or the aforementioned ion implantation system, in which it may be desirable to heat a substrate and may be important to control the composition of the gaseous species in the process chamber surrounding the substrate platen 114 (200). For example, in order to ensure that that substrate 16 is exposed only to the desired species, control of ambient 220 surrounding the substrate platen may be critical. To this end, embodiments of electrostatic clamp 204 reduce leaks 224 of gas that may be used internally within the clamp during its operation.

In some embodiments, clamp 200 comprises a base 202 and heater block 204, which may be detachable as depicted in FIG. 2a. Heater block 204 may be used to support a substrate 16 during processing. The heater block may be provided with heating apparatus (not shown), such as a thin film heater. During processing, the heater block 204 may be deliberately heated to a desired temperature to heat substrate 16. In various embodiments, the heater block 204 may be a ceramic material capable of sustaining high temperatures, such as temperatures of at least several hundred degrees Celsius. In order to draw heat from the heater block to maintain the appropriate heater block temperature, the base 202 may be provided with cooling (not shown), such as a circulating liquid. In various embodiments, the base may be a metal having good thermal conductivity, such as aluminum. Because the base 202 and heater block 204 may be dissimilar materials, during heating the two materials may expand at different rates. Accordingly, in various embodiments the base 202 and heater block 204 may be slidably coupled, such that the interfaces 210, 214 between the base 202 and heater block 204 can slide with respect to each other. In the configuration of FIG. 2a, the base 202 and heater block 204 are mechanically coupled together using springs 218. The springs 218 may exert a force normal to the common interface that joins base 202 and heater block 204 together to provide a seal along interfaces (sealing surfaces) 210, 214. This seal may form without preventing the interfaces from sliding with respect to one another in the x-y plane (as indicated in FIG. 2a). This type of coupling allows base 202 to expand or contract independently of heater block 204.

Figure 3A:
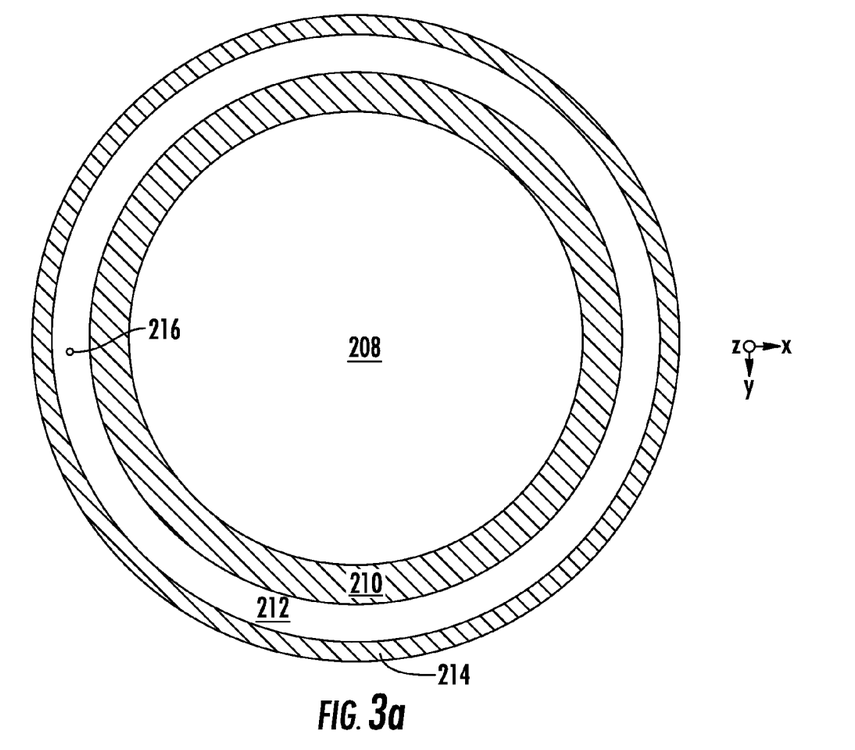
FIGS. 3a and 3b are a respective plan view and cross-section of an exemplary base of an electrostatic clamp.
Figure 3B:
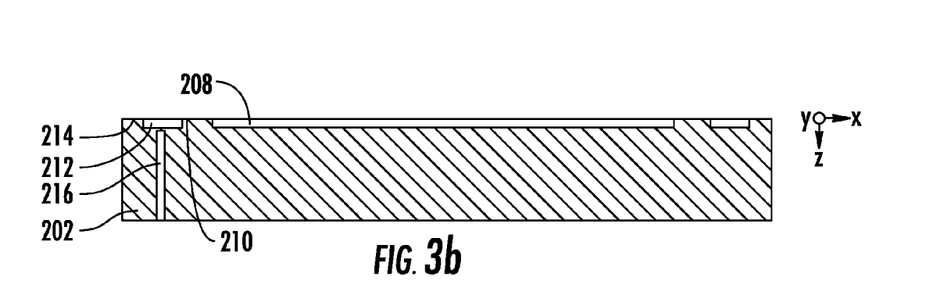

In various embodiments, an ESC may be provided with gaps (also referred to herein as "compartments" or "chambers") between heating block 204 and base 202. These gaps may constitute small gaps in the z-direction normal to the interface between heating block 204 and base 202. In some embodiments, the ESC forms two gaps, for example, gaps 208 and 212 shown in FIG. 2a. In some embodiments, as illustrated in FIG. 2a, gap 208 is a large circular gap that is circumscribed by a concentric annular gap 212. In some embodiments, the ESC gaps may be formed by providing recesses in the base 202, as depicted in FIGS. 3a, 3b. As illustrated, a circular recess 208 and annular recess 212 are provided within the base 202, such that the portion of base 202 that is to be joined to the heating block 204 comprises two annular surfaces 210 and 214.

In the embodiment of FIG. 2a, heating block 204 has a planar lower surface that forms sealing surfaces with base 202 at surfaces 210, 214. However, in other embodiments, the heating block may be provided with recesses that serve to form interior gaps when joined with a base.

Gap 208 may be coupled to an inlet (not shown) that provides a gas to gap 208 for use during substrate heating. During substrate processing, gas may be provided into gap 208 and pumped out through an outlet (not shown) such that the pressure in gap 208 is maintained in a desired range. In some embodiments, the gas pressure may be in the one-Torr, ten-Torr or hundred-Torr range, which may be sufficient to conduct heat from heating block 204 to base 202 at a desired rate.

Because the heating block 204 and base 202 may be dissimilar materials, and may slide with respect to one another along their sealing surfaces 210, 214, the sealing surfaces may fail to seal sufficiently to prevent gas from leaking out of gap 208. When gas leaks out of gap 208 along interface 210, the gas may enter gap 212 that surrounds gap 208. Gap 212, in turn, is isolated from ambient 224 by sealing surface 214. Accordingly, any gas leaking into gap 212 from gap 208 may be hindered from entering the ambient surrounding the ESC 200 by the presence of outer sealing surface 214.

In some embodiments, gap 212 is coupled to a pumping port 216 such that gas can be pumped (evacuated) out of gap 212. In the embodiment shown in FIGS. 2a and 3a, 3b, the pumping port is provided in the base 202, but may be provided in the heating block 204. This may help maintain the average pressure in gap 212 at a much lower value than that in gap 208.

Figure 2B:
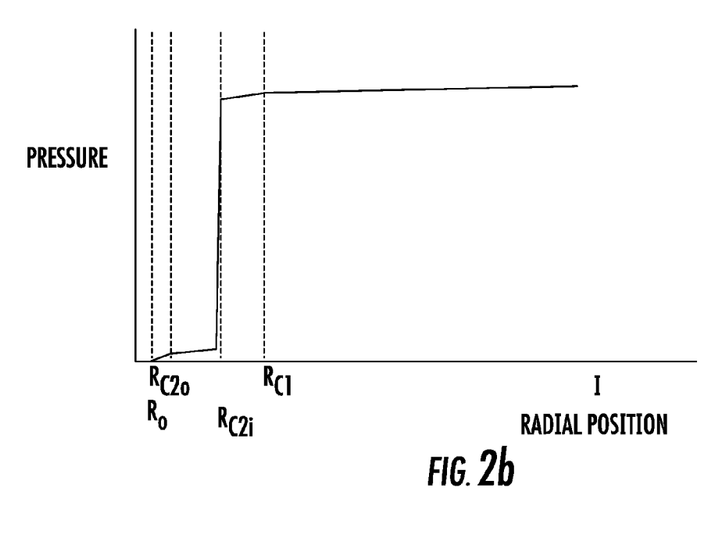
Figure 2C:
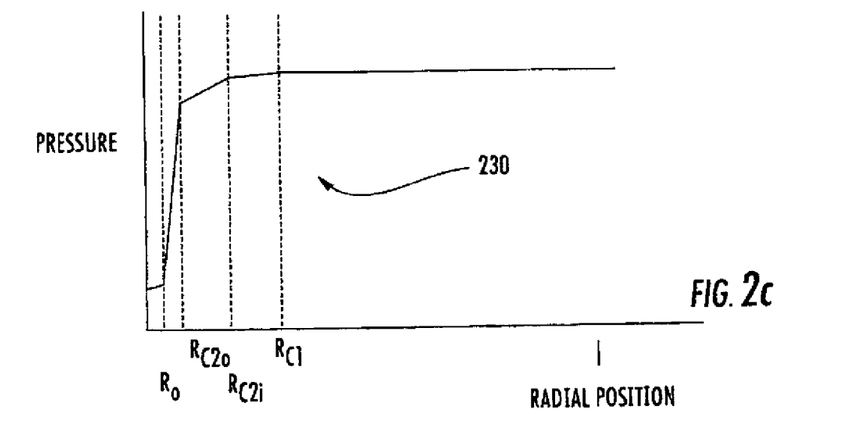

In various embodiments, the evacuation rate or pressure partial pressure of gap 212 can be tailored according to processing requirements. FIGS. 2b and 2c present two different pressure curves 220 and 230, respectively, which may represent the pressure in various portions of ESC 200 as a function of radial position for two different embodiments. Curve 220 may represent the case in which a rapid pumping rate of chamber 212 takes place, while curve 230 represent the case in which a very low (or no) pumping rate takes place.

Under processing conditions in which it is critical to minimize any gas leaks into ambient 220, a high pumping rate of gap 212 may be useful. As illustrated in FIG. 2b, during operation of ESC 200 in which gas is provided into gap 208, the inlet may be near the center causing a maximum in gas pressure towards the center at point I. Because gap 212 is evacuated, gas may leak out of gap 208 and into chamber 212, thereby causing a drop in gas pressure at $R_{C1}$ as compared to point I. In gap 212, gas 222 leaking into the gap may be rapidly pumped out, such that the average pressure in gap 212 is much lower than that in gap 208. For example, the pressure in gap 208 may be in the 10 Torr range, while the pressure in gap 212 may be in the 100 mTorr range. In addition, the pressure may rapidly drop from the inner radius $R_{c2i}$ to the outer radius $R_{c2o}$ such that the pressure of gas at interface 214 is much lower than at interface 210. Accordingly, interface 214, though forming an imperfect seal, may be sufficient to reduce the gas leak rate out of ESC 200 to an acceptable level, such as a level where impacts upon a substrate process are undetectable. If the pumping rate is high enough, the gas pressure at the outer radius $R_{c2o}$ of gap 212 may be so low that little, if any, gas escapes into ambient 220 at the outside edge $R_O$ of ESC 220, as depicted in FIG. 2b.

Accordingly, in one example, if the process window for successfully processing substrates may tolerate a drop in gas pressure across inner gap 208, a system may be arranged to evacuate gap 212 to a low gas pressure to avoid gas contamination in the ambient 220. For example, for a given heating condition, the substrate temperature may be constant or within an acceptable temperature process window over a range of different gas pressure in the gap 208, which gas pressure range may fall within that exhibited by curve 220.

In the case a small gas leak into ambient 220 is of less concern, ESC 200 provides the ability to maintain a more uniform gas pressure in gap 208, thereby providing a uniform thermal conduction towards base 202 as a function of radial position. In some embodiments, the gas pressure differential between gaps 208 and 212 may be arranged such that the drop in pressure across gap 208 is much less than in the single gap configuration of prior art ESC 10. This may be accomplished, for example, by reducing or eliminating evacuation of gap 212, such that the pressure in gap 212 is similar to that in gap 208, as illustrated by curve 230 in FIG. 2c. However, the relatively high pressure of gas in gap 212 may cause a more significant gas leak into ambient 220 as illustrated. Accordingly, in some embodiments, by varying the pressure in gap 212, substrate processing using ESC 200 may be tuned to emphasize more uniform pressure (therefore thermal conduction in the ESC) in central gap 208 on the one hand or a lower gas leak rate into the processing ambient 220 on the other hand.

Advantageously, the embodiment of ESC 200 thereby provides both the ability to obtain a more uniform gas pressure profile in a central gap region 108, as well as the ability to obtain a lower gas leakage rate into a process chamber 220 than conventional ESC apparatus, even though a tradeoff between the two may exist as detailed above.

Moreover, in some embodiments, the diameter of gap 208 may be arranged to approximate the substrate size, so that a more uniform thermal profile is experienced by the substrate. In FIG. 2a, for example, the gap 208 is nearly the size of active area A of substrate 16.

Figure 4:
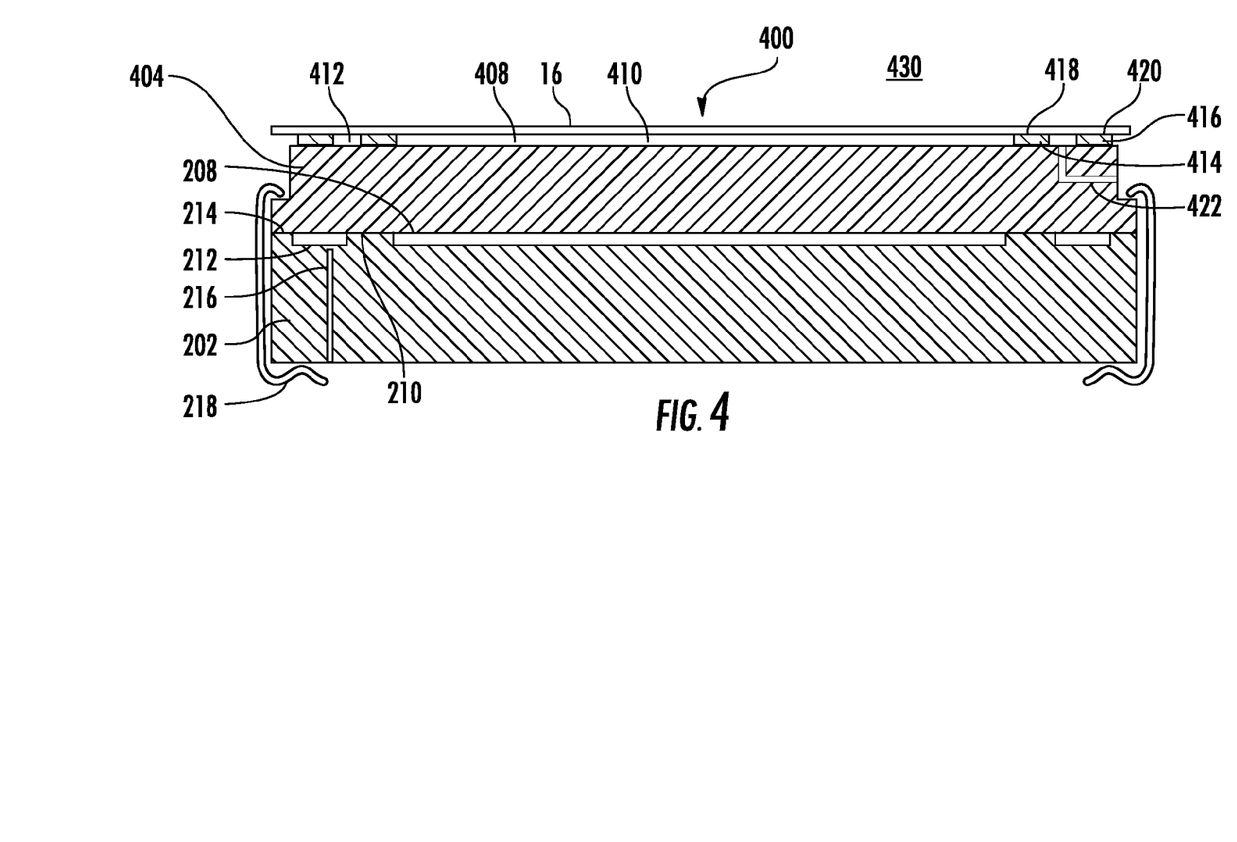
FIG. 4 is a cross-section of another electrostatic clamp embodiment.

FIG. 4 depicts another ESC embodiment in which gas flow may be provided directly upon a substrate surface. In ESC 400, a base 202 is coupled to a heating block 204 that is provided with annular features 414, 416 that protrude above main surface 410 of heater block 404. In some embodiments, the annular features 414 and 416 are may be rings that are removable from heater block 404. In other embodiments, the features may be integral to heater block 404, wherein the upper portion of heater block 404 facing substrate 16 has a recessed structure similar to base 202 depicted in FIGS. 3a, 3b. The surfaces 418, 420 of respective annular features 414 and 416 may be arranged as sealing surfaces that are configured to grip wafer 16. When wafer 16 is in contact with features 414, 416, an inner compartment 408 and an outer compartment 412 are formed between substrate 16 and the main body of heater block 404.

In some embodiments, inner compartment 408 is provided with gas inlet(s) and outlet(s) (not shown), which may be disposed in heater block 404. Flowing gas may be provided into compartment 408 during substrate processing to provide a good thermal conduction path for heat to transfer into or out of substrate 16. During substrate processing, the pressure of flowing gas may be adjusted to provide a desired thermal conductivity, as discussed previously with respect to gap 208. In some embodiments, the gas pressure in compartment 408 may be in the range of tens of Torr to hundreds of Torr. As in the case of mechanical coupling between heater block 204 and base 202, the substrate 16 and annular surfaces 418, 420 may each form an imperfect seal such that gas leaks from compartments 408 and 412. In various embodiments, compartment 412 may be provided with a pumping port 422 that serves to pump gas out of compartment 412 when a pump (not shown) is coupled to the port and turned on.

Similarly to the situation depicted in FIG. 2b, the concentric-compartment configuration provided by heater block 404 may provide a much lower pressure in the outer compartment 412 than in the inner compartment 408, thereby providing a much lower gas pressure at interface 420, which is directly coupled to the ambient 430. Accordingly, a relatively high pressure of gas may be provided in inner chamber 408 to facilitate heat transfer between substrate 16 and block 404, without substantial gas leakage into ambient 430.

In embodiments of ESC 400, the inner annular region 414 may be arranged at a radial position such that chamber 408 extends under a large portion of substrate 16, for example, chamber 408 may extend under the active area of substrate 16.

In summary, embodiments of the disclosure provide ESC configurations that provide gas-filled gaps to manage thermal conduction between a heating block and cooling base and minimize gas leakage therefrom. In some embodiments a gap is provided between the heating block and base while in other embodiments a gas-filled gap is provided on both sides of a heating block, i.e., between the heating block and a respective substrate on one hand and a base on the other hand.

In some embodiments the concentric gap arrangement of block 404 and substrate 16 depicted in FIG. 4 may be used without heating of the substrate, such as in processing situations in which it may be desirable to supply a gas between substrate 16 and a block 404 for other purposes.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. In particular, embodiments involving substrate holders other than an electrostatic clamp are possible. In addition, embodiments are possible in which more than one annular gap are provided concentric to an inner gap.

Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. An electrostatic clamp, comprising:
   a heating block for heating a substrate, the heating block having a first surface disposed toward the substrate and a second surface opposite the first surface; and
   a base arranged to adjoin at least a portion of the second surface of the heating block;
   the adjoined base and heating block mutually defining:
   an inner gap between a first portion of the heating block and the base;
   an outer gap concentric with the inner gap and arranged between a second portion of the heating block and the base, the inner and outer gaps being isolated from one another by a first sealing surface formed between the second surface of the heating block and the base;
   a first annular portion protruding above the first surface of the heating block, the first annular portion having a third sealing surface for engaging the substrate; and
   a second annular portion protruding above the first surface of the heating block and having a fourth sealing surface for engaging the substrate, wherein the first annular portion defines an inner compartment and the first and second annular portion together define an outer compartment concentric with the inner compartment when the substrate is engaged with the first and second sealing surfaces; and
   a gas inlet communicating with the inner compartment to provide a gas between the first surface of the heating block and the substrate.

2. The electrostatic clamp of claim 1, the outer gap isolated from ambient external to the electrostatic clamp by a second sealing surface between the base and heating block.

3. The electrostatic clamp of claim 1, further comprising one or more additional gaps concentric with the inner and outer gaps, each additional gap being isolated by a pair of sealing surfaces formed between the second surface and the base.

4. The electrostatic clamp of claim 1, the heating block including a heating element.

5. The electrostatic clamp of claim 1, the inner gap coupled through an inlet to a gas source that provides gas between the heating block and base.

6. The electrostatic clamp of claim 1, the base comprising a metal having a first recess and second recess that define the respective first and second gaps when the heating block and base are joined.

7. The electrostatic clamp of claim 1, comprising a first pumping port communicating with the second gap for pumping gas therefrom.

8. The electrostatic clamp of claim 7, wherein when a first pressure in the first gap is about 10 Torr or higher and a second pressure in the second gap is at least one order of magnitude lower in pressure.

9. The electrostatic clamp of claim 1, further comprising a second pumping port communicating with the outer compartment and arranged to transport gas from the outer compartment to a pump.

10. The electrostatic clamp of claim 1, wherein the base and heating block are slidably adjoined at the first and second sealing surfaces.

11. An electrostatic clamp, comprising:
    a base portion having a first surface;
    an outer block having a first surface directed toward a substrate in a process chamber and an opposing second surface directed toward at least a portion of the first surface of the base portion;
    a first annular portion coupled to the second surface of the outer block, the first annular portion having a first sealing surface;
    a second annular portion coupled to the second surface of the outer block and having a second sealing surface, wherein the first annular portion defines an inner gap and the first and second annular portions together define an outer gap concentric with the inner gap;
    a third annular portion protruding above the first surface of the outer block, the third annular portion having a third sealing surface for engaging the substrate; and
    a fourth annular portion protruding above the first surface of the outer block and having a fourth sealing surface for engaging the substrate, wherein the fourth annular portion defines an inner compartment and the first and second annular portions together define an outer compartment concentric with the inner compartment intermediate the substrate and the first surface of the outer block when the substrate is placed on the third and fourth sealing surfaces.

12. The electrostatic clamp of claim 11, further comprising:
    a gas inlet communicating with the inner gap to provide a gas between the first surface of the outer block and the substrate; and
    a pumping port communicating with the outer gap and arranged to transport gas from the outer gap to a pump.

13. The electrostatic clamp of claim 11, the outer block comprising a ceramic body and a heater portion arranged to heat the substrate.

14. The electrostatic clamp of claim 11, the base comprising a metal having a first recess and second recess that define the respective inner and outer gaps when the outer block and base are adjoined.

15. An ion implantation system, comprising:
    an ion source for providing ions to a substrate; and
    an electrostatic clamp arranged to hold the substrate, the electrostatic clamp comprising:

a heating block having a first surface directed toward the substrate and a second surface opposite the first surface; and a base arranged to slidably adjoin the second surface of the heating block, the slidably adjoined base and heating block mutually defining:

an inner gap disposed between a first portion of the heating block and the base; and an outer gap concentric with the inner gap and disposed between a second portion of the heating block and the base, the inner and outer gaps being isolated from one another by a first sealing surface, the outer gap being isolated from ambient external to the electrostatic clamp by a second sealing surface between the base and heating block;

the heating block and the substrate mutually defining:

an inner compartment disposed between the heating block and the substrate; and an outer compartment concentric with the inner compartment and formed between the heating block and the substrate, the inner and outer compartments being isolated from one another by a third sealing surface disposed between the base and the substrate;

the outer compartment being isolated from ambient external to the electrostatic clamp by a fourth sealing surface disposed between the base and the substrate.

16. The ion implantation system of claim 15, further comprising:

a gas inlet communicating with the inner gap and with a gas source that provides gas to the inner gap;

and a first pumping port communicating with the outer gap for pumping gas therefrom.

17. The ion implantation system of claim 15, further comprising:

a gas inlet communicating with the inner compartment to provide a gas between the first surface of the heating block and the substrate; and a second pumping port communicating with the outer compartment and arranged to transport gas from the outer compartment to a pump.

* * * * *

UNITED STATES PATENT AND TRADEMARK OFFICE
CERTIFICATE OF CORRECTION

PATENT NO. : 8,669,540 B2
APPLICATION NO. : 12/983710
DATED : March 11, 2014
INVENTOR(S) : Miller et al.

Page 1 of 2

It is certified that error appears in the above-identified patent and that said Letters Patent is hereby corrected as shown below:

<u>In the Drawings Sheet 2 of 5,</u>
Replace Figures 2A, and 2B, with Figures 2A, 2B and 2C (See Attached Sheet):

Signed and Sealed this
Second Day of September, 2014

Michelle K. Lee
*Deputy Director of the United States Patent and Trademark Office*